United States Patent
Campbell

(10) Patent No.: US 7,129,755 B2
(45) Date of Patent: Oct. 31, 2006

(54) HIGH-FANIN STATIC MULTIPLEXER

(75) Inventor: Brian J. Campbell, Sunnyvale, CA (US)

(73) Assignee: Broadcom Corporation, Irvine, CA (US)

(*) Notice: Subject to any disclaimer, the term of this patent is extended or adjusted under 35 U.S.C. 154(b) by 57 days.

(21) Appl. No.: 10/821,575

(22) Filed: Apr. 9, 2004

(65) Prior Publication Data

US 2005/0225359 A1    Oct. 13, 2005

(51) Int. Cl.
*H03K 19/0944* (2006.01)
*H03K 17/693* (2006.01)

(52) U.S. Cl. ............... 326/106; 327/409; 327/410

(58) Field of Classification Search .......... 326/106; 327/408, 409, 410
See application file for complete search history.

(56) References Cited

U.S. PATENT DOCUMENTS 5,543,731 A * 8/1996 Sigal et al. .................. 326/40
5,773,995 A * 6/1998 Crocker ..................... 326/108
6,124,736 A * 9/2000 Yamashita et al. .......... 326/113

OTHER PUBLICATIONS

Horenstein, "Microelectric Circuits & Devices", no month, 1990, Prentice-Hall, Inc., pp. 753-755.*

* cited by examiner

Primary Examiner—Daniel Chang
(74) Attorney, Agent, or Firm—Bruce Garlick; Garlick,Harrison&Markison

(57) ABSTRACT

An improved high-fanin multiplexer that is highly-scalable, fast and area-efficient. In one embodiment of the present invention, multiple logic "legs" are attached to a common output line. Each leg comprises one pMOS pull-up transistor and one nMOS pull-down transistor. The gate of the pMOS transistor in each leg is connected to the output of an And-Or-Invert (AOI) gate whose inputs are connected to a plurality of select lines and a plurality of data lines. The gate of the nMOS transistor in each leg is connected to the output of an Or-And-Invert (OAI) gate whose inputs are connected to a plurality of select lines (the logical complements of the select lines for the AOI), and a plurality of data input lines. The high-fanin multiplexer of the present invention offers numerous advantages over the prior art. In particular, the high-fanin multiplexer of the present invention has very small self-loading allowing a large number of inputs while also maintaining a high fan out speed. In addition, the small input capacitive load allows the driving gates to be small, thereby conversing surface area within an integrated circuit.

18 Claims, 3 Drawing Sheets

HIGH-FANIN STATIC MULTIPLEXER

BACKGROUND OF THE INVENTION

1. Field of the Invention

The present invention relates in general to the field of multiplexers used in integrated circuits. More specifically, the method and apparatus of the present invention provides a fast, highly-scalable and area-efficient implementation of a high-fanin multiplexer for use in integrated circuits.

2. Description of the Related Art

The multiplexer is one of the most common circuits implemented in modern integrated circuits. In its most basic form, one of two input signals is selected as an output signal based on the value of a control signal. In more complex multiplexers, a plurality of control signals turn transfer gates on and off in accordance with predetermined rules to enable various data signals to be generated as outputs. Although it is possible for a multiplexer to accept a large number of input signals, it is generally difficult to scale a multiplexer and, therefore, there are practical limits to the number in inputs that can be accepted.

Multiplexers that accept a large number of inputs are often referred to as "high-fanin" multiplexers. There is often a need to implement high-fanin multiplexers in complex integrated circuits. One of the problems encountered with high-fanin multiplexers, however, is a significant increase in size and a significant decrease in speed as the number of inputs increases. The speed and area issues increase at a rate that is more than linear with the number of inputs. Most designs, therefore, limit the implementation to static multiplexers of six inputs or less. These smaller fanin multiplexers are then connected in series to provide a multiplexer module with the desired number of inputs.

It would be desirable, however, to have a high-fanin multiplexer that provides a larger number of inputs with a speed and area advantage over comparable multiplexers that are implemented by connecting a plurality of smaller fanin multiplexers in series. Such a high-fanin multiplexer is provided by the method and apparatus of the present invention, as described in more detail below.

SUMMARY OF THE INVENTION

The present invention overcomes the shortcomings of the prior art by providing an improved high-fanin multiplexer that is highly scalable, fast and area-efficient. In one embodiment of the invention, the high-fanin multiplexer comprises a plurality of logic data input units comprising "legs" that are attached to a common output line. Each leg comprises one pMOS pull-up transistor and one nMOS pull-down transistor. The gate of the pMOS transistor in each leg is connected to the output of an And-Or-Invert (AOI) gate whose inputs are connected to a plurality of select lines and a plurality of data lines. The gate of the nMOS transistor in each leg is connected to the output of an Or-And-Invert (OAI) gate whose inputs are connected to a plurality of select lines (the logical complements of the select lines for the AOI), and a plurality of data input lines. Because only one nMOS and one pMOS transistor is connected to the output line, the self-loading for the multiplexer is small.

The high-fanin multiplexer of the present invention offers numerous advantages over the prior art. In particular, the high-fanin multiplexer of the present invention has very small self-loading allowing a large number of inputs while also maintaining a high fanout speed. In addition, the small input capacitive load allows the driving gates to be small, thereby conserving surface area within an integrated circuit. In addition, the static input logic provides excellent noise margins compared to some prior art multiplexers.

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
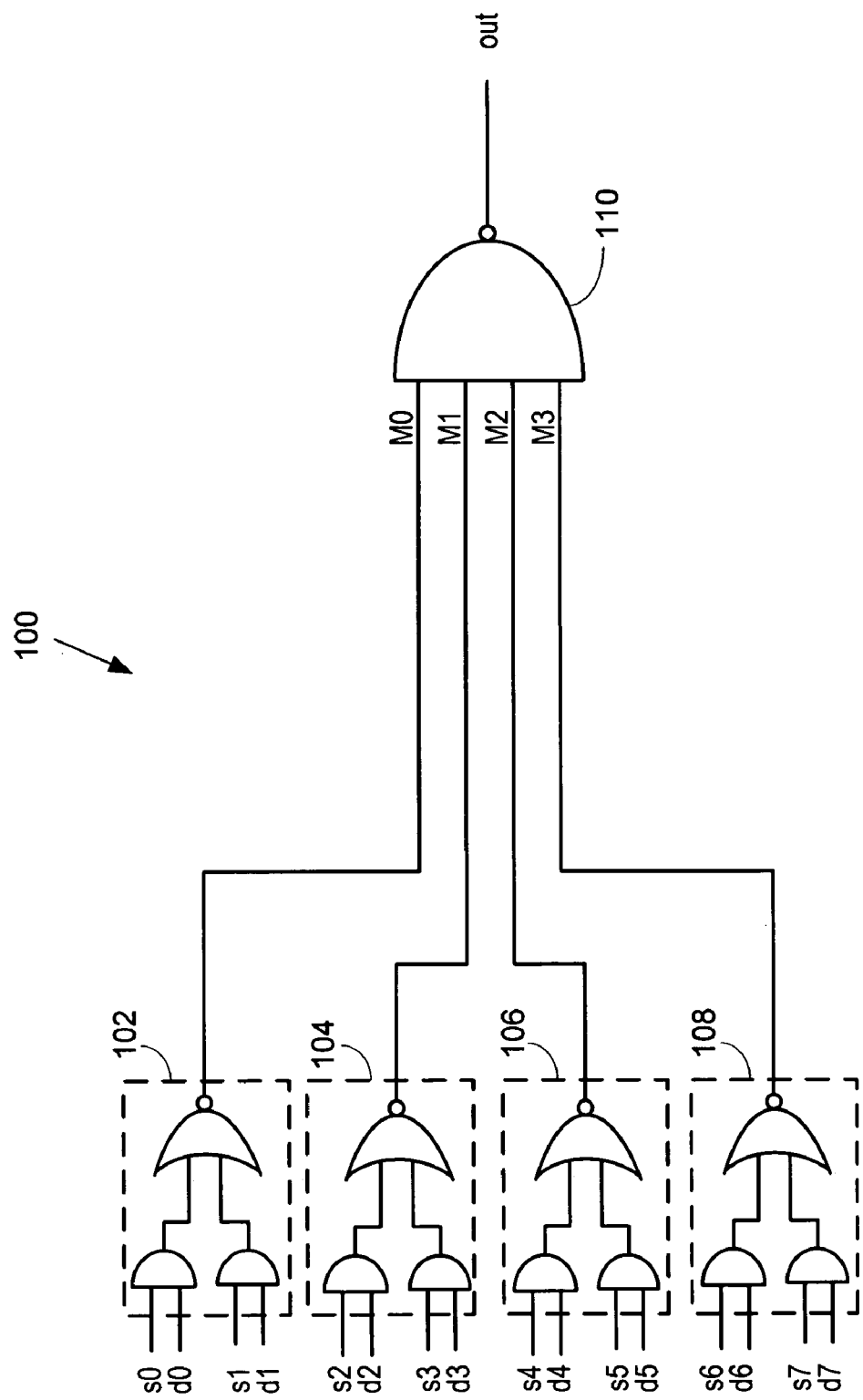
FIG. 1 is an illustration of a multiplexer comprising a plurality of And-Or-Invert gates.

FIG. 1 is an illustration of a simple multiplexer 100 comprising a plurality of AOI logic gates 102, 104, 106, and 108 connected to a NAND gate 110. Each of the AOI gates is operable to receive two data inputs and two select signal inputs. For example, AOI gate 102 is operable to receive data inputs d0 and d1 and select signal inputs s0 and s1. The outputs of the respective AOI gates M0, M1, M2 and M3 are provided as inputs to the NAND gate 110. In operation, no more than one select line is asserted during any cycle. The simple multiplexer illustrated in FIG. 1 is capable of receiving a total of eight data inputs and requires a four-input NAND gate.

In operation, only one of the select lines that provides an input to the AOI gates 102, 104, 106, and 108 is "high" during any particular cycle. The data input associated with the "high" select line will be generated as the output of the multiplexer 100. For example, if select line s2=1 and s0=s1=s3=s4=s5=s6=s7=0, then the output of the function of the multiplexer will be the value for the data input d2. Furthermore, if s2=1, all others and all other select lines are 0, then M0=M2=M3=1, these inputs (M0, M2, M3) will have no influence on the output of the NAND gate 110. Furthermore, since the other select line input to the AOI 104, s3=0, the data input d3 will have no influence on the value of M1 provided as an input to the NAND gate 110. However, since s2=1, M1=d2# and since M0=M2=M3=1, the output=d2 and the multiplexer is, therefore, accomplished. As will be understood by those of skill in the art, a multiplexer similar in operation to that discussed hereinabove can be constructed using Or-And-Invert (OAI) gates and a NOR gate.

As will be understood by those of skill in the art, a NAND gate capable of handling four inputs can result in a significant decrease in the operational speed of the multiplexer. In practice, therefore, it is very common to limit a multiplexer such as that illustrated in FIG. 1 to three AOI input gates, thereby requiring only three inputs to the NAND gate 110 to ensure acceptable operational speed.

Figure 2:
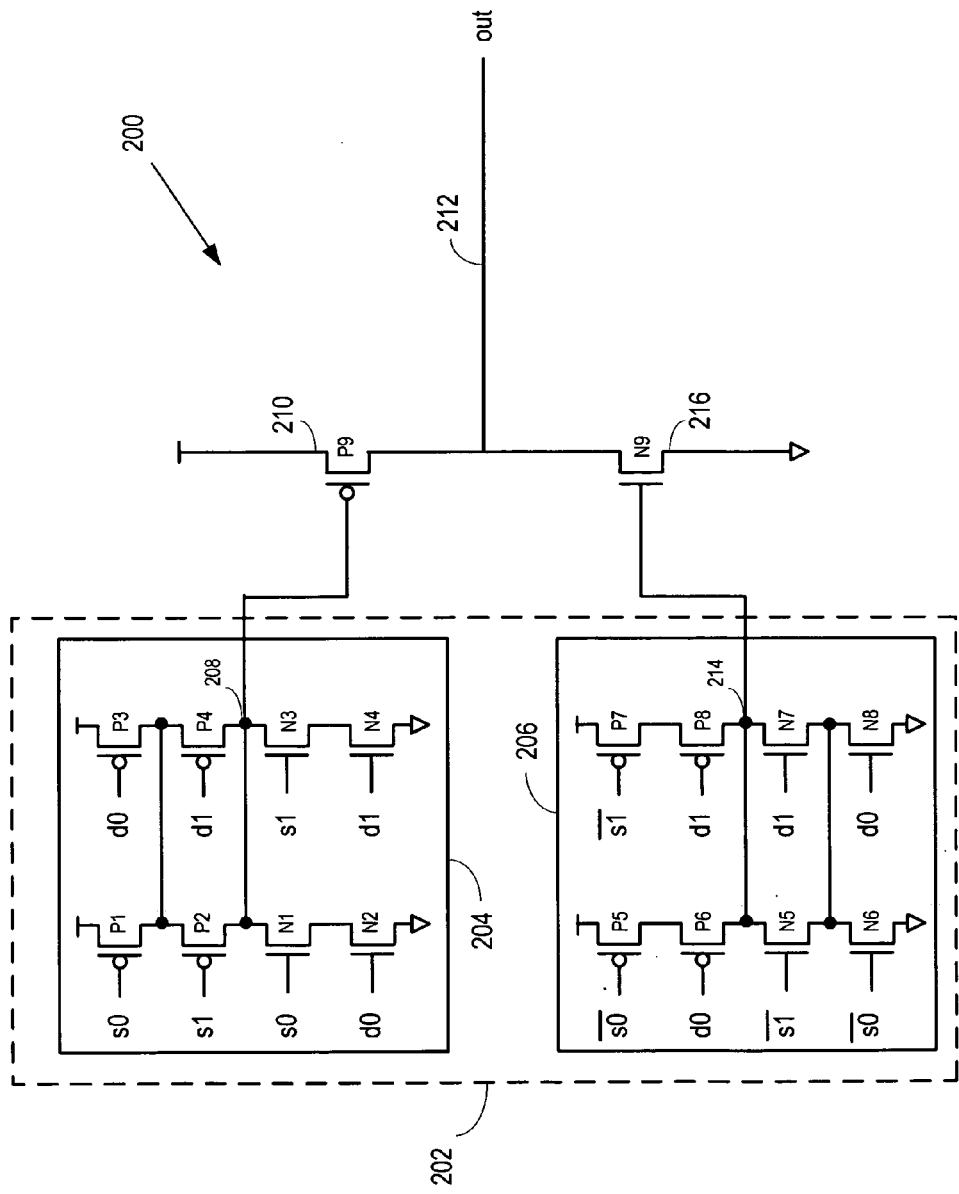
FIG. 2 is an illustration of an embodiment of the high-fanin multiplexer of the present invention.

FIG. 2 is an illustration of one data input unit 202 of the high-fanin multiplexer of the present invention. A plurality of data input signals and select signals are provided to first and second logic modules 204 and 206. As will be discussed in greater detail below, the first logic module 204 generates an output signal at node 208 that controls a first pMOS pull-up transistor 210 that is connected to an output line 212. The second logic module 206 also receives data input signals and select input signals (complementary select input signal corresponding to the select signals for the first logic module 204). The second logic module 206 is operable to generate a signal at node 214 that controls the pull-down nMOS transistor 216. As discussed hereinabove in connection with the multiplexer illustrated in FIG. 1, only one select signal can be "high" during any particular cycle. The first and second logic modules 204 and 206 each comprise a plurality of pMOS transistors and nMOS transistors that are operable to receive the various data and select signals. For example, first logic module 204 comprises pMOS transistors P1 and P2 that receive select signals s0 and s1 and pMOS transistors P3 and P4 that receive data input signals d0 and d1. The s0 and s1 select signals are also provided as inputs to nMOS transistors N1 and N3 and the data input signals d0 and d1 are also provided as inputs to nMOS transistors N2 and N4.

Referring to the second logic module 206, it can be seen that complementary select signals s0# (s_# is sometimes illustrated in the drawings as "s_") and s1# are provided as inputs to pMOS transistors P5 and P7 and data input signals d0 and d1 are provided to pMOS transistors P6 and P8, respectively. The s1# and s0# are provided to nMOS transistors N5 and N6, respectively, and the data input signals d1 and d0 are provided as inputs to nMOS transistors N7 and N8.

Operation of the first logic module 204 and second logic module 206 can be understood by the signal condition wherein the select input signal s1 is "high" and all other select lines are "low." There are two possible cases for the corresponding data input d1. For the case where d1 is low, it is desired for the output of the data input module 202 to be "low." For the signal condition where d1 is low, nMOS transistors P7 and P8 in second logic module 206 will be turned on. Node 214 will, therefore, be "high" and, therefore, nMOS transistor 216 will be turned "on," thereby placing a low output signal on the output line 212. For the signal condition wherein s1 is "high" and d1 is also "high," it is desired for the output signal placed on output line 212 to be "high." When d1 is "high," nMOS transistors N3 and N4 are turned "on." Node 208 is, therefore, "low" and pMOS transistor 210 will be turned "on" thereby placing a high output signal on output line 212.

As will be discussed in greater detail hereinbelow in connection with FIG. 3, the data input module 202 can be replicated to create a plurality of data input stages to implement a high-fanin multiplexer. There will, therefore, be conditions where both s0 and s1 are "low" since only one select signal can be high in any of the various data input units during a single cycle. For the signal condition wherein s0 and s1 are both low, nMOS transistors N1 and N3 are "off" and, therefore, node 208 cannot be pulled "low." Furthermore, it can be seen that pMOS transistors P5 and P7 will also be "off" and, therefore, node 214 cannot be pulled "high." Therefore, if s0 and s1 are both "low," pMOS transistor 210 and nMOS transistor 216 are both turned off, thereby presenting a minimum load to the output line 212. One of the advantages of the present invention is minimum self-loading is created because only one nMOS and one pMOS transistor is connected to the output line.

Figure 3:
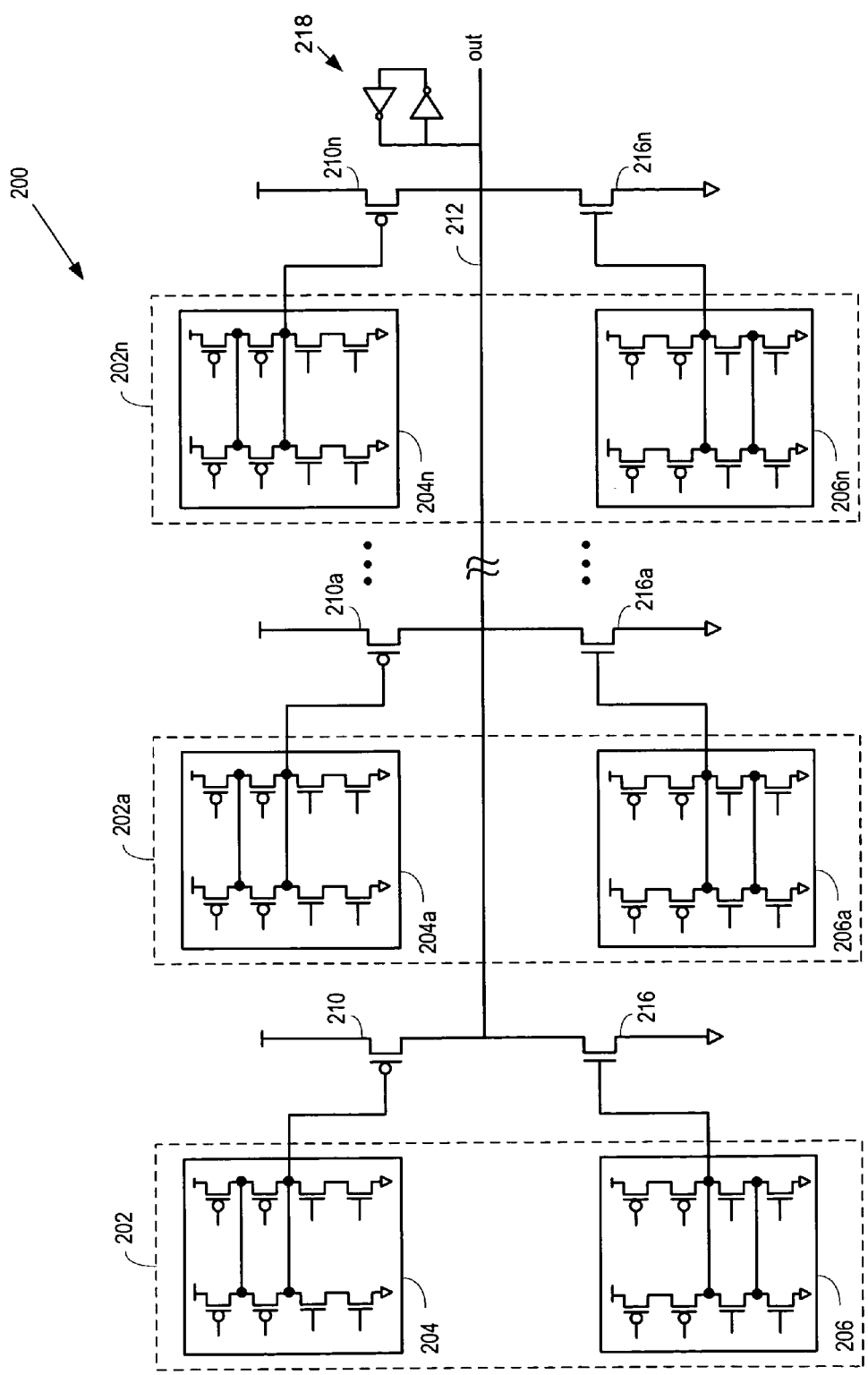
FIG. 3 is an illustration of a high-fanin multiplexer comprising a plurality of stages of inputs using the method and apparatus of the present invention.

FIG. 3 is an illustration of a plurality of data input units 202, 202a, . . . 202n connected to an output line 212. Each of the data input units comprise first and second logic modules of the type discussed hereinabove in connection with FIG. 2. For example, data input module 202a comprises a first logic module 204a and second logic module 206a; likewise, data input module 202n comprises a first logic module 204n and a second logic module 206n. The respective logic modules are connected to corresponding pMOS or nMOS transistors to generate the appropriate data output signals in response to various combinations of select signals and data input signals. For example, the output of first logic module 204a is connected to the gate of pMOS transistor 210a and the output of second logic module 206a is connected to the gate of nMOS transistor 216a; likewise, the output of first logic module 204n is connected to the gate of transistor 210n and the output of logic module 206n is connected to the gate of nMOS transistor 216n.

The high-fanin multiplexer of the present invention can be implemented using between one and six of the data input units 202, 202a, . . . , 202n. Furthermore, the number of signal inputs for each of the data input units can be increased to three select signals and three data signals. It is possible, therefore, to implement a high-fanin multiplexer with up to 18 data input signals using the present invention.

The high-fanin multiplexer illustrated in FIG. 3 comprises a keeper 218 that is operable to maintain the output line 212 in a predetermined state. In the high-fanin multiplexer of the present invention, the logic elements illustrated in the logic modules 204, 204a, . . . , 204n and 206, 206a, . . . , 206n, comprise static logic. In one embodiment of the present invention, at least one select line is always "hot," thereby eliminating the necessity of having a keeper 218.

The high-fanin multiplexer of the present invention offers numerous advantages over the prior art. In particular, the high-fanin multiplexer of the present invention has very small self-loading allowing a large number of inputs while also maintaining a high fanout speed. In addition, the small input capacitive load allows the driving gates to be small, thereby conserving surface area within an integrated circuit. In addition, the static input logic provides excellent noise margins compared to some prior art multiplexers.

Although the present invention has been described in detail, it should be understood that various changes, substitutions and alterations can be made hereto without departing from the spirit and scope of the invention as defined by the appended claims.

What is claimed is:

1. A multiplexer, comprising:
 a first logic module operable to receive a first plurality of data input signals and a first set of select signals and to generate a first output signal in response thereto;
 a second logic module operable to receive said first set of data input signals and a first set of complementary select signals, wherein each and every one of the first set of complementary select signals is complementary corresponding to said first set of select signals and to generate a second output signal in response thereto;
 an output line operable to receive a plurality of output signals from said first and second logic modules;
 a first gate operable to receive said first output signal and to transfer said first output signal to said output line; and
 a second gate operable to receive said second output signal and to transfer said second output signal to said output line;
 wherein the capacitive loading of said first and second logic modules is isolated from said output line by said first and second gates, respectively.

2. The multiplexer of claim 1, wherein said first and second logic modules comprise static logic.

3. The multiplexer of claim 2, wherein said first gate comprises a pMOS transistor operable to invert said first signal transferred to said output line.

4. The multiplexer of claim 2, wherein said second gate comprises an nMOS transistor operable to invert said second signal transferred to said output line.

5. The multiplexer of claim 1, further comprising a keeper circuit operable to maintain said output line at a predetermined voltage.

6. The multiplexer of claim 1, wherein at least one of said select signals is "high," and said output line is not connected to a keeper.

7. A multiplexer, comprising:
a plurality of data input units, wherein each of said data input units comprises:
  a first logic module operable to receive a first plurality of data input signals and a first set of select signals and to generate a first output signal in response thereto;
  a second logic module operable to receive said first set of data input signals and a first set of complementary select signals, wherein each and every one of the first set of complementary select signals is complementary corresponding to said first set of select signals and to generate a second output signal in response thereto;
  an output line operable to receive a plurality of output signals from said first and second logic modules;
  a first gate operable to receive said first output signal and to transfer said first output signal to said output line; and
  a second gate operable to receive said second output signal and to transfer said second output signal to said output line;
  wherein the capacitive loading of said first and second logic modules of each of said data input units is isolated from said output line by said first and second gates, respectively; and
wherein only one of said data input units has an active select signal at any time and wherein said plurality of data input units operate cooperatively to define a fanin multiplexer having a plurality of data input stages.

8. The multiplexer of claim 7, wherein said first and second logic modules of said plurality of data input units comprise static logic.

9. The multiplexer of claim 8, wherein each of said first gates in said data input units comprises a pMOS transistor operable to invert said first signal transferred to said output line.

10. The multiplexer of claim 9, wherein each of said second gates in said data input units comprises an nMOS transistor operable to invert said second signal transferred to said output line.

11. The multiplexer of claim 10, further comprising a keeper circuit operable to maintain said output line at a predetermined voltage.

12. The multiplexer of claim 11, wherein at least one of said select signals is "high," and said output line is not connected to a keeper.

13. A method of operating a multiplexer, comprising:
receiving a first plurality of data input signals and a first set of select signals in a first logic module and generating a first output signal in response thereto;
receiving said first plurality of data input signals and a first set of complementary select signals wherein each and every one of the first set of complementary select signals is complementary corresponding to said first set of select signals in a second logic module and generating a second output signal in response thereto;
using a first gate to receive said first output signal and to transfer said first output signal to an output line; and
using second gate to receive said second output signal and to transfer said second output signal to said output line;
using said first and second gates to isolate the capacitive loading of said first and second logic modules, respectively, from said output line..

14. The multiplexer of claim 13, wherein said first and second logic modules comprise static logic.

15. The multiplexer of claim 14, wherein said first gate comprises a pMOS transistor operable to invert said first signal transferred to said output line.

16. The multiplexer of claim 14, wherein said second gate comprises an nMOS transistor operable to invert said second signal transferred to said output line.

17. The multiplexer of claim 13, further comprising a keeper circuit operable to maintain said output line at a predetermined voltage.

18. The multiplexer of claim 13, wherein said at least one of select signals is "high," and said output line is not connected to a keeper.

* * * * *